(12) United States Patent
Shimizu

(10) Patent No.: US 12,656,409 B2
(45) Date of Patent: Jun. 16, 2026

(54) EQUALIZATION CELL DETERMINATION DEVICE AND METHOD

(71) Applicant: TOYOTA JIDOSHA KABUSHIKI KAISHA, Toyota (JP)

(72) Inventor: Osamu Shimizu, Komaki (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 97 days.

(21) Appl. No.: 18/420,000

(22) Filed: Jan. 23, 2024

(65) Prior Publication Data

US 2024/0345177 A1 Oct. 17, 2024

(30) Foreign Application Priority Data

Apr. 12, 2023 (JP) .................................. 2023-064902

(51) Int. Cl.
G01R 31/396 (2019.01)
G01R 31/388 (2019.01)
(Continued)

(52) U.S. Cl.
CPC ......... G01R 31/396 (2019.01); G01R 31/388 (2019.01); H02J 7/52 (2026.01); H02J 7/965 (2026.01)

(58) Field of Classification Search
CPC ... G01R 31/396; G01R 31/388; H02J 7/0014; H02J 7/007186; Y02E 60/10
See application file for complete search history.

(56) References Cited

U.S. PATENT DOCUMENTS

2018/0219391 A1 8/2018 Ishikawa
2020/0266645 A1* 8/2020 Kim ..................... H02J 7/00302
2020/0403420 A1* 12/2020 Nagase ............... H01M 10/482

FOREIGN PATENT DOCUMENTS

JP 2014-176158 A 9/2014
JP 2018-125965 A 8/2018
(Continued)

OTHER PUBLICATIONS

F. Wen, C. Lin, J. Jiang and Z. Wang, "A New Evaluation Method to the Consistency of Lithium-Ion Batteries in Electric Vehicles," 2012 Asia-Pacific Power and Energy Engineering Conference, Shanghai, China, 2012, pp. 1-4 (Year: 2012).*
(Continued)

*Primary Examiner* — Daniel R Miller
(74) *Attorney, Agent, or Firm* — SoraIP, Inc.

(57) ABSTRACT

For lithium-ion batteries that are composed of multiple battery cells and have a flat region in the SOC-OCV characteristic curve where the rate of change in open circuit voltage with respect to state of charge is less than or equal to a predetermined value, an equalization method is used to determine which battery cells should be subjected to equalization processing. The equalization cell determination device includes an acquisition unit that acquires the voltages of a plurality of battery cells immediately after charging of a lithium-ion battery is stopped, and a voltage difference between the voltages of the plurality of battery cells acquired by the acquisition unit. The battery includes a calculation unit and a determination unit that determines a battery cell to be subjected to equalization processing based on the plurality of voltage differences calculated by the calculation unit.

5 Claims, 4 Drawing Sheets

(51) Int. Cl.
   *H02J 7/52*     (2026.01)
   *H02J 7/96*     (2026.01)

(56)     References Cited

FOREIGN PATENT DOCUMENTS

JP        2018-129958  A      8/2018
WO       2017/169127  A1    10/2017

OTHER PUBLICATIONS

B. Zhang, M. Chen and D. Yang, "Investigation of the polarization effect in lithium iron phosphate battery for electric vehicles," 2014 IEEE Conference and Expo Transportation Electrification Asia-Pacific (ITEC Asia-Pacific), Beijing, China, 2014, pp. 1-5 (Year: 2014).*
Q. Yao, D. D.-C. Lu and G. Lei, "Rapid Open-Circuit Voltage Measurement Method for Lithium-Ion Batteries Using One-Cycle Bipolar-Current Pulse," in IEEE Journal of Emerging and Selected Topics in Industrial Electronics, vol. 2, No. 2, pp. 132-141, Apr. 2021 (Year: 2021).*

* cited by examiner

EQUALIZATION CELL DETERMINATION DEVICE AND METHOD

CROSS-REFERENCE TO RELATED APPLICATION

This application claims priority to Japanese Patent Application No. 2023-064902 filed on Apr. 12, 2023, incorporated herein by reference in its entirety.

BACKGROUND

1. Technical Field

The present disclosure relates to a technique for determining which battery cells should be subjected to equalization processing in a battery pack (battery) made up of a plurality of battery cells.

2. Description of Related Art

Japanese Unexamined Patent Application Publication No. 2014-176158 (JP 2014-176158 A) discloses a voltage equalization device and a voltage equalization method that improve accuracy of equalization of battery voltage, by performing cell balancing processing that takes into account effects of polarization of batteries.

SUMMARY

Conventionally, as a technique for determining which battery cells should be subjected to equalization processing in a battery pack, there is a technique in which, following waiting for effects of battery polarization to disappear, the open circuit voltage (OCV) of each battery cell is measured, and a battery cell to be subjected to equalization processing is determined based on a voltage difference (variance) between these open circuit voltages that are measured.

With lithium-ion batteries (e.g., ternary lithium-ion batteries) that do not have a so-called "flat region" in a state of charge (SOC)-OCV characteristic curve in which the open circuit voltage hardly changes as to the state of charge (SOC) (see FIG. 5), the above technique can be used to distinguish voltage differences in the open circuit voltage due to variation in the state of charge, over the entire SOC-OCV characteristic curve. However, with lithium-ion batteries (e.g., lithium iron phosphate batteries) that have a flat region in the SOC-OCV characteristic curve (see FIG. 4), distinguishing voltage differences in the open circuit voltage due to variation in the state of charge in the flat region section is difficult.

Accordingly, there is room for further study regarding a technique for determining which battery cells should be subjected to equalization processing, which can be applied to lithium-ion batteries having a flat region in the SOC-OCV characteristic curve.

The present disclosure has been made in view of the above problem, and accordingly an object thereof is to provide an equalization cell determination device and a method thereof that can be applied to lithium-ion batteries having a flat region in an SOC-OCV characteristic curve.

In order to solve the above problem, an embodiment of the disclosed technology is an equalization cell determination device that determines, with regard to a lithium-ion battery that is made up of a plurality of battery cells and that includes a flat region in a state of charge (SOC)-open circuit voltage (OCV) characteristic curve at which a rate of change in the open circuit voltage with respect to the state of charge is no greater than a predetermined value, which battery cells are to be subjected to equalization processing, the equalization cell determination device including an acquisition unit that acquires each of voltages of the battery cells immediately after charging of the lithium-ion battery is stopped, a calculation unit that calculates voltage differences among each of the voltages of the battery cells acquired by the acquisition unit, and a determination unit that determines a battery cell to be subjected to the equalization processing, based on a plurality of the voltage differences calculated by the calculation unit.

According to the equalization cell determination device and the like of the present disclosure, in a battery pack having lithium-ion batteries as cells having a flat region in an SOC-OCV characteristic curve, which of the battery cells should be subjected to equalization processing can be determined based on voltage that is acquired, even when the state of charge (SOC) of the battery cells is in the flat region.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

The equalization cell determination device and the like of the present disclosure performs an equalization processing based on the terminal voltage of each battery cell acquired immediately after charging of a lithium-ion battery configured with a plurality of battery cells is stopped. Determine. Thereby, it is possible to suitably determine which battery cells should undergo equalization processing based on the voltage between each terminal where the influence of polarization remains.

Hereinafter, an embodiment of the present disclosure will be described in detail with reference to the drawings.

EMBODIMENT

Configuration

Figure 1:
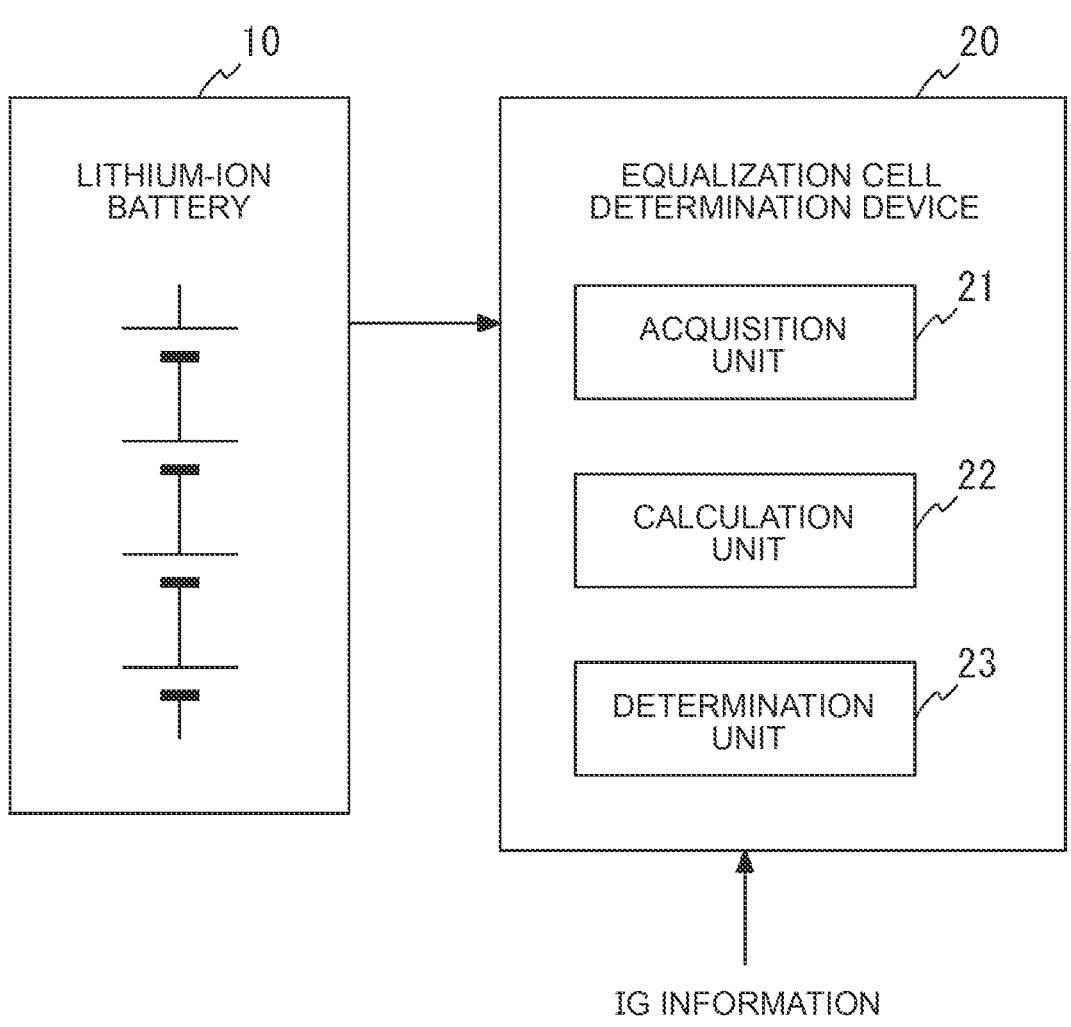
FIG. 1 is a functional block diagram of an equalization cell determination device and its peripheral parts according to an embodiment of the present disclosure.

FIG. 1 is a functional block diagram of an equalization cell determination device 20 and its peripheral parts according to an embodiment of the present disclosure. The functional blocks illustrated in FIG. 1 include a lithium-ion battery 10 and an equalization cell determination device 20. The lithium-ion battery 10 and the equalization cell determination device 20 can be mounted on a vehicle, for example.

The lithium-ion battery 10 is a secondary battery configured to be chargeable and dischargeable. An example of the lithium-ion battery 10 mounted on a vehicle is an auxiliary battery that supplies power necessary for auxiliary equipment other than that for driving the vehicle. The lithium-ion battery 10 of this embodiment is an assembled battery composed of a plurality of battery cells. The lithium-ion battery 10 made up of this assembled battery is typically configured by a plurality of battery cells connected in series. Moreover, the lithium-ion battery 10 as an assembled battery may be configured by connecting two or more cell blocks in series, each of which has several battery cells connected in parallel.

Figure 4:
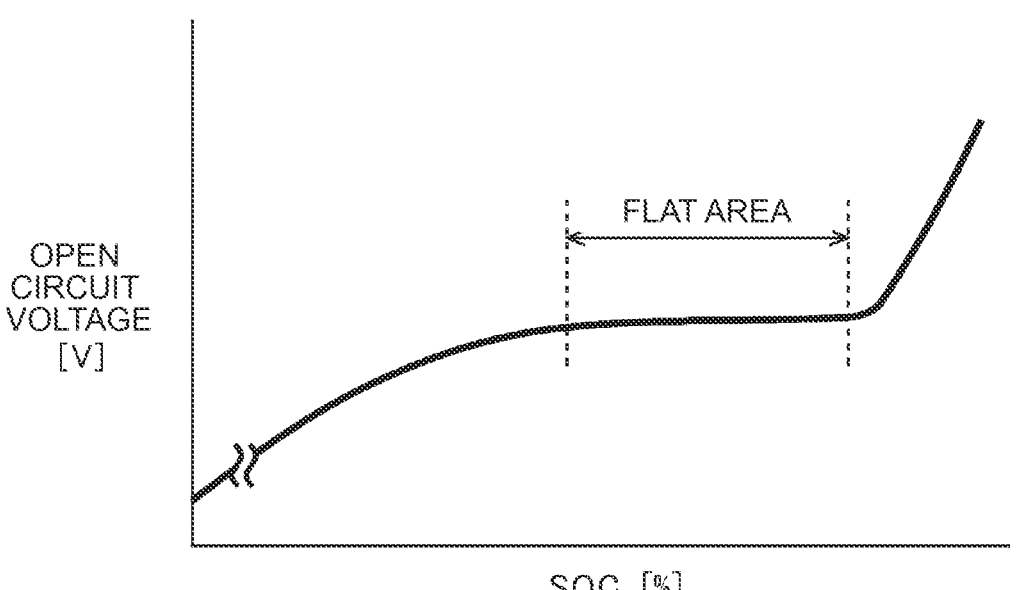
FIG. 4 is an example of the SOC-OCV characteristic curve of an iron phosphate-based lithium-ion battery.
Figure 5:
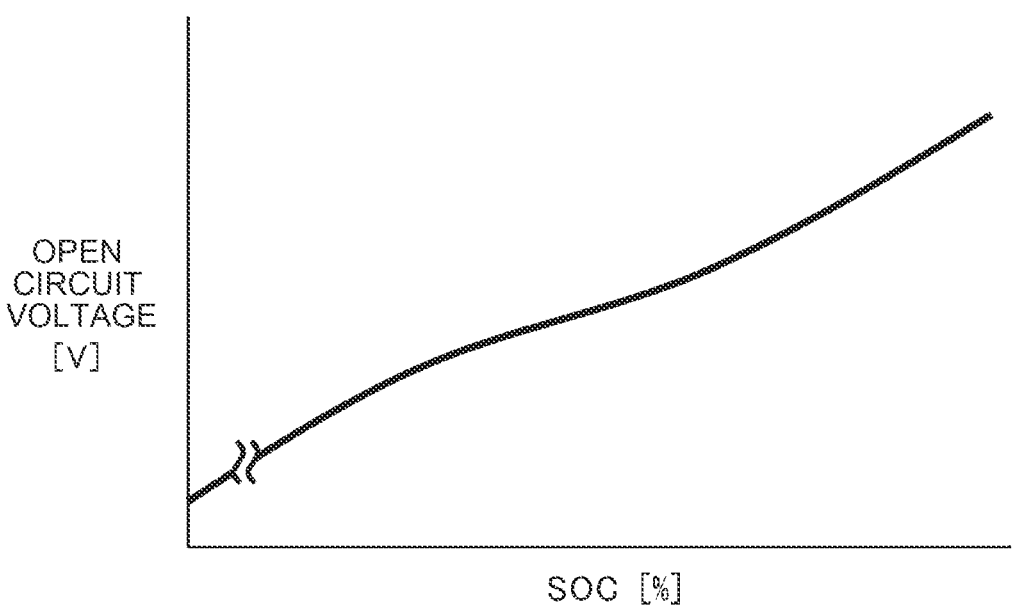
FIG. 5 shows an example of the SOC-OCV characteristic curve of a ternary lithium-ion battery.

Each battery cell of the lithium-ion battery 10 has an SOC-OCV characteristic curve that shows the relationship between the battery's state of charge (SOC) and the open circuit voltage (OCV), the absolute value of the rate of change in open circuit voltage with respect to the state of charge. A battery is used that has a flat area where the value is less than or equal to a predetermined value. This predetermined value is a value determined based on the specifications of the battery and the like. An example of a battery having a flat area is an iron phosphate lithium-ion battery (LFP battery). FIG. 4 is a diagram showing an example of an SOC-OCV characteristic curve of an iron phosphate-based lithium-ion battery.

The equalization cell determination device 20 performs processing (equalization processing) for equalizing variations in voltage (and state of charge) occurring among the plurality of battery cells for the plurality of battery cells that constitute the lithium-ion battery 10. This is a device for determining whether a necessary battery cell exists. Voltage variations among a plurality of battery cells occur due to variations in the amount of self-discharge of each battery cell. This equalization cell determination device 20 includes an acquisition unit 21, a calculation unit 22, and a determination unit 23.

The acquisition unit 21 acquires the voltages of the plurality of battery cells that constitute the lithium-ion battery 10, respectively. The voltage of a battery cell is a voltage difference (potential difference) between a positive terminal and a negative terminal of a battery cell, and can be obtained, for example, via a detection element such as a voltage sensor provided in the battery cell. Immediately after the charging of the lithium-ion battery 10 is stopped (or completed), more typically, the acquisition unit 21 detects that the charging of the lithium-ion battery 10 is stopped (or completed) and the ignition of the vehicle is stopped. Immediately after the switch is turned off (IG-OFF), the voltage between the terminals of each of the plurality of battery cells is obtained. Note that the state of the ignition switch of the vehicle can be grasped based on IG information provided from the electronic control unit (ECU) of the vehicle.

The calculation unit 22 extracts the inter-terminal voltage having the smallest value from among the plurality of inter-terminal voltages acquired by the acquisition unit 21 from the plurality of battery cells constituting the lithium-ion battery 10. Then, the calculation unit 22 calculates the voltage difference between the extracted minimum inter-terminal voltage and other inter-terminal voltages other than the minimum inter-terminal voltage.

The determination unit 23 determines whether there is a battery cell in which the voltage difference between the terminal voltages calculated by the calculation unit 22 is equal to or greater than a predetermined threshold value. This determination is made in order to confirm whether the voltage variation among the plurality of battery cells that constitute the lithium-ion battery 10 is large. The threshold value is arbitrarily determined based on the capacity, performance, etc. of the lithium-ion battery 10. Then, if there is a battery cell for which the voltage difference between the terminal voltages is determined to be equal to or greater than the threshold value, the determination unit 23 sets that battery cell as a target for performing the equalization processing.

Figure 2:
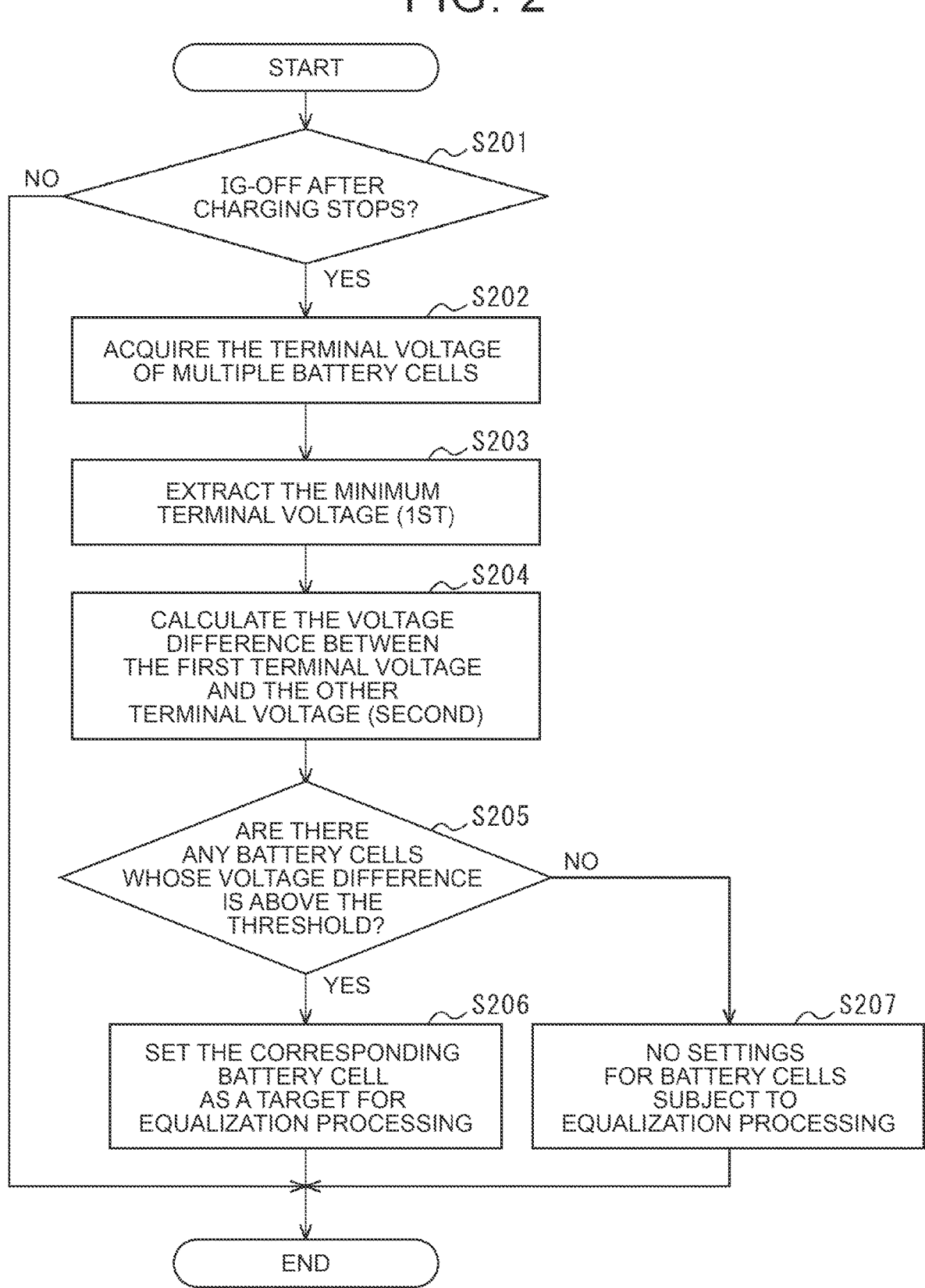
FIG. 2 is a processing flowchart of equalization cell determination performed by the equalization cell determination device.

Part or all of the equalization cell determination device 20 described above may be configured as an electronic control unit (ECU) that typically includes a processor such as a microcomputer, a memory, an input/output interface, and the like. This electronic control device can realize some or all of the functions of the above-mentioned acquisition unit 21, calculation unit 22, and determination unit 23 by having a processor read and execute a program stored in the memory. Control Next, with further reference to FIG. 2, control performed by the equalization cell determination device 20 according to an embodiment of the present disclosure will be described. FIG. 2 is a flowchart illustrating a procedure for determining which battery cells should undergo equalization processing in the lithium-ion battery 10, which are executed by each component of the equalization cell determination device 20 mounted on the vehicle. The equalization cell determination processing shown in FIG. 2 is started, for example, at a timing based on a fixed cycle or at a timing when a specific event is detected.

S201

The acquisition unit 21 determines whether the ignition switch of the vehicle has been turned off (IG-OFF) after charging of the lithium-ion battery 10 has stopped. Note that when the equalization cell determination device 20 is applied to a vehicle other than a vehicle, determination regarding the state of the ignition switch can be omitted.

If the acquisition unit 21 determines that the ignition switch of the vehicle has been turned off after charging of the lithium-ion battery 10 has stopped (S201, Yes), the processing advances to S202. On the other hand, if the acquisition unit 21 determines that the ignition switch of the vehicle has not been turned off after charging of the lithium-ion battery 10 has stopped (S201, No), the equalization cell determination processing ends.

S202

The acquisition unit 21 acquires information about the plurality of battery cells constituting the lithium-ion battery 10 immediately after the ignition switch of the vehicle is turned off (IG-OFF) after charging of the lithium-ion battery 10 has stopped (or ended). Obtain the voltage between each terminal.

For example, when the lithium-ion battery 10 has a configuration in which battery cell A, battery cell B, battery cell C, and battery cell D are connected in series, the terminal-to-terminal voltage Va of battery cell A, the terminal-to-terminal voltage Vb of the battery cell B, the terminal-to-terminal voltage Vc of the battery cell C, and the terminal-to-terminal voltage Vd of the battery cell D are acquired.

When the acquisition unit 21 acquires the inter-terminal voltages of the plurality of battery cells, the processing advances to S203.

S203

The calculation unit 22 extracts the inter-terminal voltage having the smallest value (hereinafter referred to as "first inter-terminal voltage") from among the plurality of inter-terminal voltages corresponding to the plurality of battery cells acquired in S202 above.

When the calculation unit 22 extracts the minimum first inter-terminal voltage, the processing advances to S204.
S204

The calculation unit 22 calculates the difference between the first inter-terminal voltage extracted in S203, which is the minimum, and another inter-terminal voltage other than the first inter-terminal voltage (hereinafter referred to as "second inter-terminal voltage"). Calculate the voltage difference (potential difference) of each.

For example, consider a case where, in the lithium-ion battery 10 configured with the above-mentioned battery cell A, battery cell B, battery cell C, and battery cell D, the inter-terminal voltage Va of battery cell A is the minimum value. In this case, the voltage difference (=Vb-Va) between the terminal voltage Va (first terminal voltage) of battery cell A and the terminal voltage Vb (second terminal voltage) of battery cell B, The voltage difference (=Vc-Va) between the terminal-to-terminal voltage Va of cell A and the terminal-to-terminal voltage Vc (second terminal-to-terminal voltage) of battery cell C, and the terminal-to-terminal voltage Va of battery cell A and the terminal of battery cell D. The voltage difference (=Vd-Va) with the inter-terminal voltage Vd (second inter-terminal voltage) is calculated.

When the calculation unit 22 calculates the voltage difference between the first inter-terminal voltage and each second inter-terminal voltage, the processing advances to S205.
S205

The determination unit 23 compares the voltage difference between the first inter-terminal voltage and each second inter-terminal voltage calculated in S204 above with a predetermined threshold value. Then, as a result of the comparison, the determination unit 23 determines whether there is a second terminal-to-terminal voltage for which the voltage difference is equal to or greater than the threshold value, that is, whether there is a battery cell that has obtained a second terminal-to-terminal voltage for which the voltage difference is equal to or greater than the threshold value.

Figure 3:
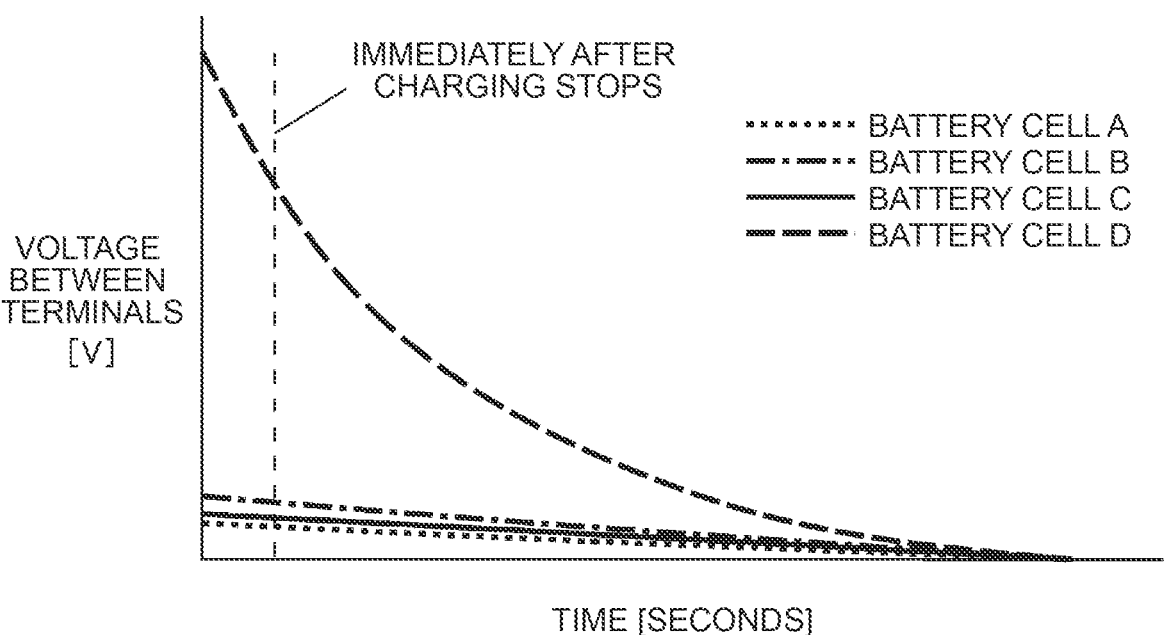
FIG. 3 is an example of the voltage transition of each battery cell immediately after a lithium-ion battery is fully charged.

For example, consider a case where the voltage between the terminals of battery cell A, battery cell B, battery cell C, and battery cell D that constitute the lithium-ion battery 10 described above changes as shown in FIG. 3. FIG. 3 is a diagram showing an example of the voltage transition of each battery cell immediately after the lithium-ion battery 10 is fully charged. In this case, if the threshold value is appropriately set so that the voltage difference between the terminal voltage Va of battery cell A and the terminal voltage Vd of battery cell D (=Vd-Va) corresponds to the judgment, the voltage immediately after charging is Battery cell D, which is significantly different from other battery cells A, B, and C, can be identified. Note that two or more battery cells may be specified depending on how the plurality of battery cells vary.

If the determination unit 23 determines that there is a battery cell in which a second inter-terminal voltage with a voltage difference equal to or greater than the threshold value is obtained (S205, Yes), the processing proceeds to S206. On the other hand, when the determination unit 23 determines that there is no battery cell from which the second inter-terminal voltage for which the voltage difference is equal to or greater than the threshold value is obtained (S205, No), the processing proceeds to S207.
S206

The determination unit 23 sets the battery cell determined in S205 above as a target for performing the equalization processing. A predetermined equalization processing is performed on the battery cells set as targets for the equalization process. A well-known processing can be applied to this equalization processing.

When the battery cell is set as a target to be subjected to the equalization processing by the determination unit 23, the equalization cell determination processing is ended.
S207

Since the battery cell was not determined in S205, the determination unit 23 ends the equalization cell determination processing without setting the battery cell as the target of the equalization processing. That is, in this case, it is determined that the equalization processing is not necessary for all the battery cells that constitute the lithium-ion battery 10.
Operations and Effects As described above, according to the equalization cell determination device 20 and the equalization cell determination method according to an embodiment of the present disclosure, a predetermined value at which polarization is eliminated after charging of the lithium-ion battery 10 is stopped (or terminated) is achieved. Instead of the voltage between the terminals of each battery cell obtained after waiting for some time, each battery that still has the influence of polarization (there is a polarization difference) obtained immediately after charging of the lithium-ion battery 10 has stopped (or ended) A battery cell to be subjected to equalization processing is determined based on the voltage between the terminals of the cell.

Through this processing, even if the state of charge (SOC) of the battery cell is on the flat area in a battery assembly (lithium-ion battery 10) that has lithium-ion batteries whose cells have a flat area on the SOC-OCV characteristic curve, equalization can be achieved. It is possible to appropriately determine which battery cells should be subjected to processing.

Furthermore, in the equalization cell determination device 20 and the equalization cell determination according to an embodiment of the present disclosure, after charging of the lithium-ion battery 10 is stopped (or completed), the inter-terminal voltages of the battery cells are acquired without waiting for a predetermined time.

Due to this processing, the time required to determine the battery cell to be subjected to the equalization processing can be shortened.

Although one embodiment of the present disclosure has been described above, the present disclosure includes not only the above-mentioned equalization cell determination device but also an equalization cell determination method executed by the equalization cell determination device including a processor and a memory. It can be understood as a control program for a cell determination method, a computer-readable non-temporary recording medium storing the control program, or a vehicle equipped with an equalized cell determination device.

The equalization cell determination device and the like of the present disclosure can be used, for example, when controlling a lithium-ion battery composed of a plurality of battery cells.

What is claimed is:

1. An equalization cell determination device that determines, with regard to a lithium-ion battery that is made up of a plurality of battery cells and that includes a flat region in a state of charge (SOC)-open circuit voltage (OCV) characteristic curve at which a rate of change in the open circuit voltage with respect to the state of charge is no greater than a predetermined value, which battery cells are to be subjected to equalization processing, the equalization cell determination device being configured as an electronic control unit comprising:

a processor; and a memory storing instructions to cause the processor to acquire, via a voltage sensor disposed on each of the plurality of battery cells, each of voltage values of the plurality of battery cells immediately after charging of the lithium-ion battery is stopped and while polarization effects in the lithium-ion battery remain;

extract a minimum voltage value among the acquired voltage values of the plurality of battery cells;

calculate voltage value differences between the minimum voltage value and each of the acquired voltage values of the plurality of battery cells excluding the minimum voltage value;

compare each of the voltage value differences with a predetermined threshold value;

determine whether there exists a battery cell among the plurality of battery cells whose voltage value difference from the minimum voltage value is equal to or greater than the predetermined threshold value;

set the battery cell among the plurality of battery cells whose voltage value difference from the minimum voltage value is equal to or greater than the predetermined threshold value as a target battery cell to be subjected to the equalization processing in a case where there exists the battery cell among the plurality of battery cells whose voltage value difference from the minimum voltage value is equal to or greater than the predetermined threshold value; and determine that the equalization processing is not necessary for all of the plurality of battery cells included in the lithium-ion battery in a case where there is no battery cell having a voltage value whose voltage value difference from the minimum voltage value is equal to or greater than the predetermined threshold value.

2. The equalization cell determination device according to claim 1, wherein the lithium-ion battery is installed in a vehicle, and the electronic control unit is configured to be mounted on the vehicle.

3. The equalization cell determination device according to claim 1, wherein the predetermined threshold value is determined based on capacity or performance of the lithium-ion battery.

4. The equalization cell determination device according to claim 1, wherein the instructions further cause the processor not to set any battery cell as the target battery cell in the case where there is no battery cell having a voltage value whose voltage value difference from the minimum voltage value is equal to or greater than the predetermined threshold value.

5. The equalization cell determination device according to claim 1, wherein the instructions further cause the processor to acquire each of the voltage values of the plurality of battery cells immediately after charging of the lithium-ion battery is stopped and prior to lapse of a predetermined time required for the polarization effects in the lithium-ion battery to disappear.

* * * * *